United States Patent
Yeh et al.

(10) Patent No.: US 9,149,906 B2
(45) Date of Patent: Oct. 6, 2015

(54) APPARATUS FOR CMP PAD CONDITIONING

(75) Inventors: Hsiu-Ming Yeh, Hsinchu (TW); Feng-Inn Wu, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 982 days.

(21) Appl. No.: 13/227,155

(22) Filed: Sep. 7, 2011

(65) Prior Publication Data
US 2013/0059503 A1    Mar. 7, 2013

(51) Int. Cl.
*B24B 53/017* (2012.01)
*B24B 53/12* (2006.01)

(52) U.S. Cl.
CPC .............. *B24B 53/017* (2013.01); *B24B 53/12* (2013.01)

(58) Field of Classification Search
CPC .... B24B 53/003; B24B 53/02; B24B 53/053; B24B 53/08; B24B 53/12; B24B 53/017
USPC .......................... 451/21, 56, 65, 72, 443, 444
See application file for complete search history.

(56) References Cited

U.S. PATENT DOCUMENTS

| | | | |
|---|---|---|---|
| 5,885,137 A * | 3/1999 | Ploessl | 451/56 |
| 5,902,173 A * | 5/1999 | Tanaka | 451/56 |
| 6,123,607 A | 9/2000 | Ravkin et al. | |
| 6,200,199 B1 | 3/2001 | Gurusamy et al. | |
| 6,200,207 B1 | 3/2001 | Hsu | |
| 6,371,836 B1 * | 4/2002 | Brown et al. | 451/56 |
| 7,510,463 B2 * | 3/2009 | Kim et al. | 451/56 |
| 7,815,495 B2 * | 10/2010 | Xu et al. | 451/443 |
| 2002/0065029 A1 * | 5/2002 | Huang et al. | 451/72 |
| 2006/0035568 A1 * | 2/2006 | Dunn | 451/56 |

OTHER PUBLICATIONS

"Dressing: Trends and Future Developments for Diamond CMP Pad Conditioners;" Industrial Diamond Review Jan. 2004; pp. 14-21.

* cited by examiner

*Primary Examiner* — Timothy V Eley
(74) *Attorney, Agent, or Firm* — Haynes and Boone, LLP

(57) ABSTRACT

A chemical mechanical polishing (CMP) apparatus is provided that includes a conditioning disc for conditioning a polishing pad of the CMP apparatus. The conditioning disc includes a plurality of portions of subsystem discs. The portions may be regions of the disc that are concentric. Each portion of the disc is operable to rotate at a different angular velocity. In some embodiments, a different applied loading is provided to each of the portions of the disc in addition to or in lieu of the different angular velocities.

18 Claims, 12 Drawing Sheets

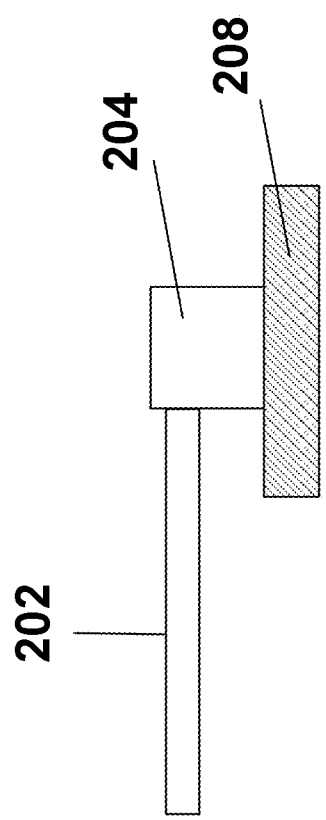

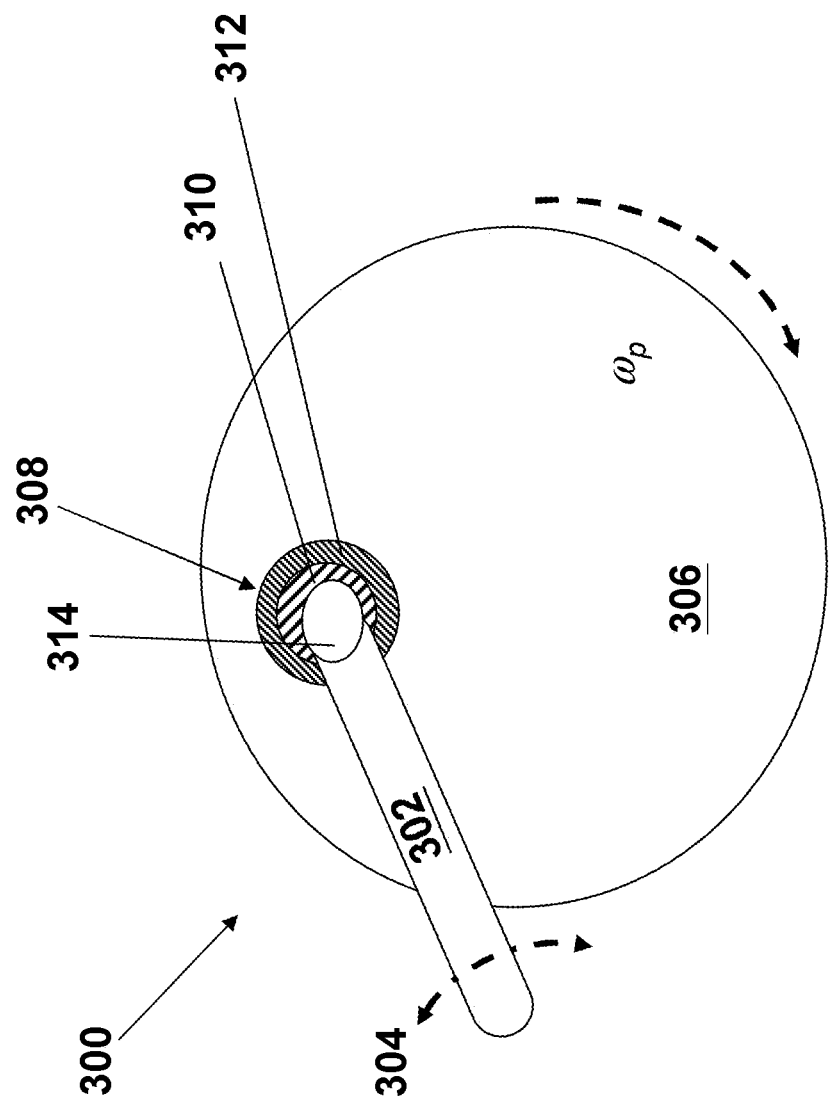

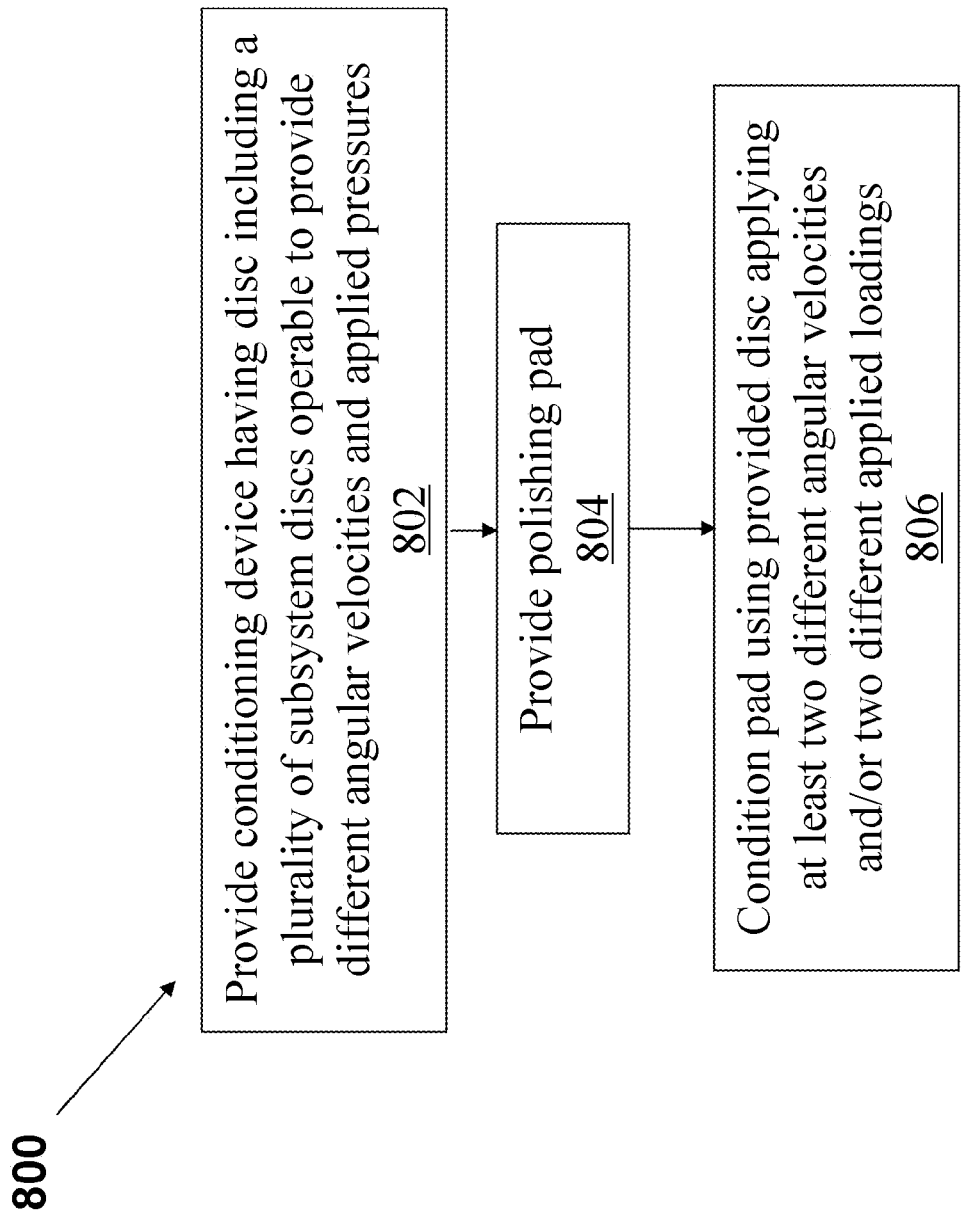

APPARATUS FOR CMP PAD CONDITIONING

BACKGROUND

The present disclosure relates to semiconductor device fabrication and in particular to conditioning of polishing pad used during substrate polishing and planarization processes of semiconductor fabrication.

During semiconductor fabrication a substrate may be polished or planarized to remove a layer or portion thereof from the substrate. One such process is known as chemical mechanical polishing (CMP). In a typical CMP process, a substrate is supported by an apparatus, which presses the substrate against a polishing pad (e.g., a rotating pad). Often the pad polishes the substrate in the presence of a polishing slurry, water, or other fluid. During the polishing, the properties of the polishing pad may be altered, for example, changing the polishing rate or quality (e.g., uniformity). Thus, pad conditioning is performed to restore the polishing pad by reconditioning the surface of the polishing pad that comes into contact with the substrate during polishing. Improving the pad conditioning is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2c is a cross-sectional view of the embodiment of FIG. 2a.

FIG. 3a is a top view of an embodiment of a conditioning apparatus according to one or more aspect of the present disclosure. FIG. 3b is a cross-sectional view of the embodiment of FIG. 3a.

FIG. 8 is a flow chart illustrating an embodiment of a method according one or more aspects of the present disclosure.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. It is noted that term disc, as used herein, is a conditioning disc for conditioning and/or regenerating a polishing pad. The portions that make up the disc (e.g., segments) may be referred to as subsystem discs. The subsystem discs (or portions of the conditioning disc), may be discrete elements that are coupled together to form a single circular conditioning disc, as described in further detail below.

Figure 1:
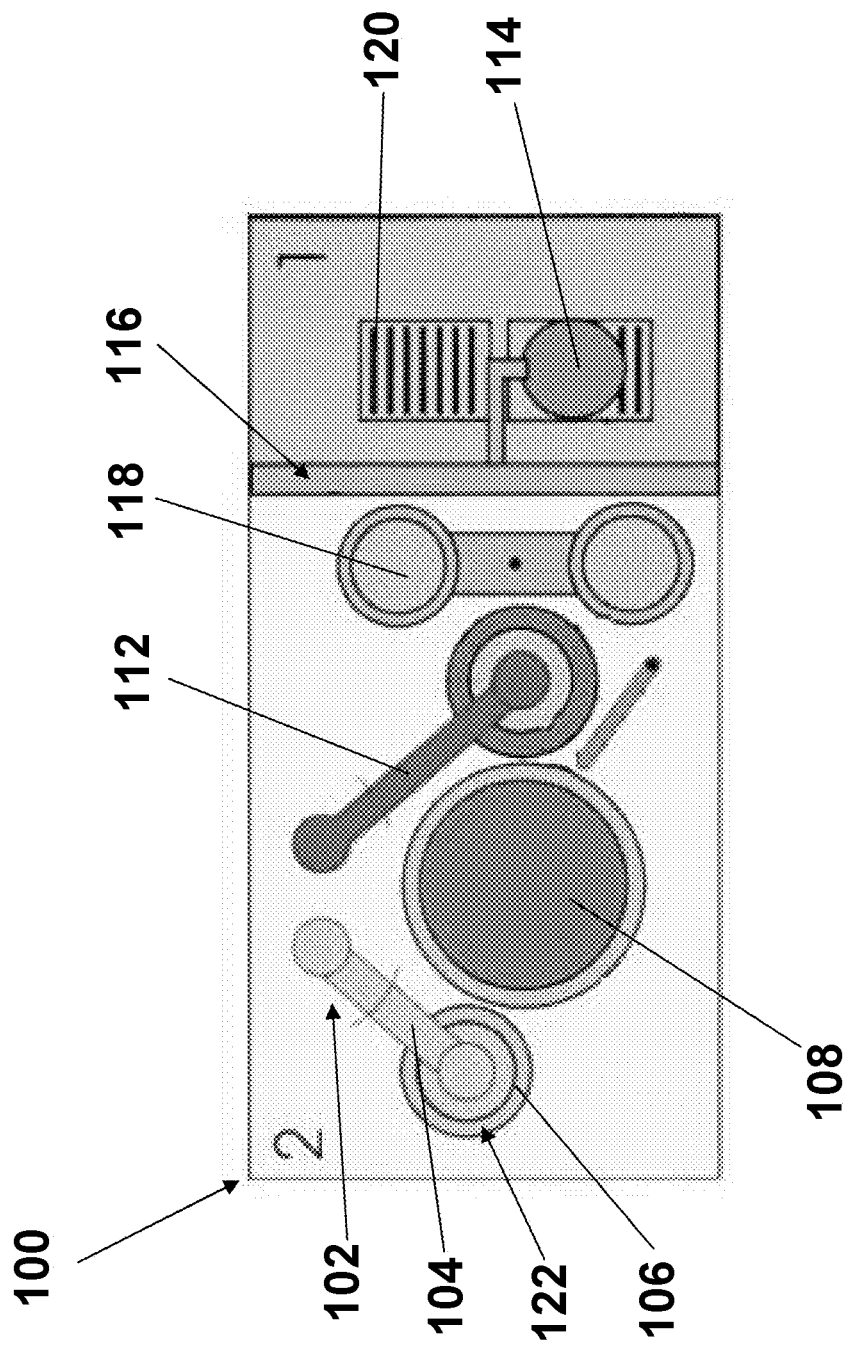
FIG. 1 is a top view of any embodiment of a chemical mechanical polishing (CMP) tool.

Illustrated in FIG. 1 is an embodiment of a CMP apparatus (tool) 100. The CMP tool 100 includes a conditioning device 102. The conditioning device 102 includes a dresser arm 104, operable to move a conditioning disc 106. The conditioning device 102 also includes a dresser head 122 operable to provide a rotation and/or apply a load to the conditioning disc 106. An exemplary dresser head is described in U.S. Pat. No. 6,200,199 to Gurusamy et al., which is hereby incorporated by reference in its entirety. The CMP tool 100 includes a rotating platen 108 having a polishing pad 110 disposed thereon.

A wafer arm 112 is operable to hold a semiconductor wafer 114 on the arm 112. The wafer 114 is positioned (face down) on the rotating platen 108 and a downward force of the wafer 114 against the pad 110 is provided, thus performing the polishing process. The CMP tool 100 further includes a handling system 116 which includes staged areas 118 for positioning of the wafer 114 before and after the polishing process and a device 120 for transferring the wafer 114 from its cassette to the tool. The CMP tool 100 includes various control systems including end point detection monitors, platen temperature controls, slurry delivery and control systems, and/or other systems typically employed in the art.

Figure 2A:
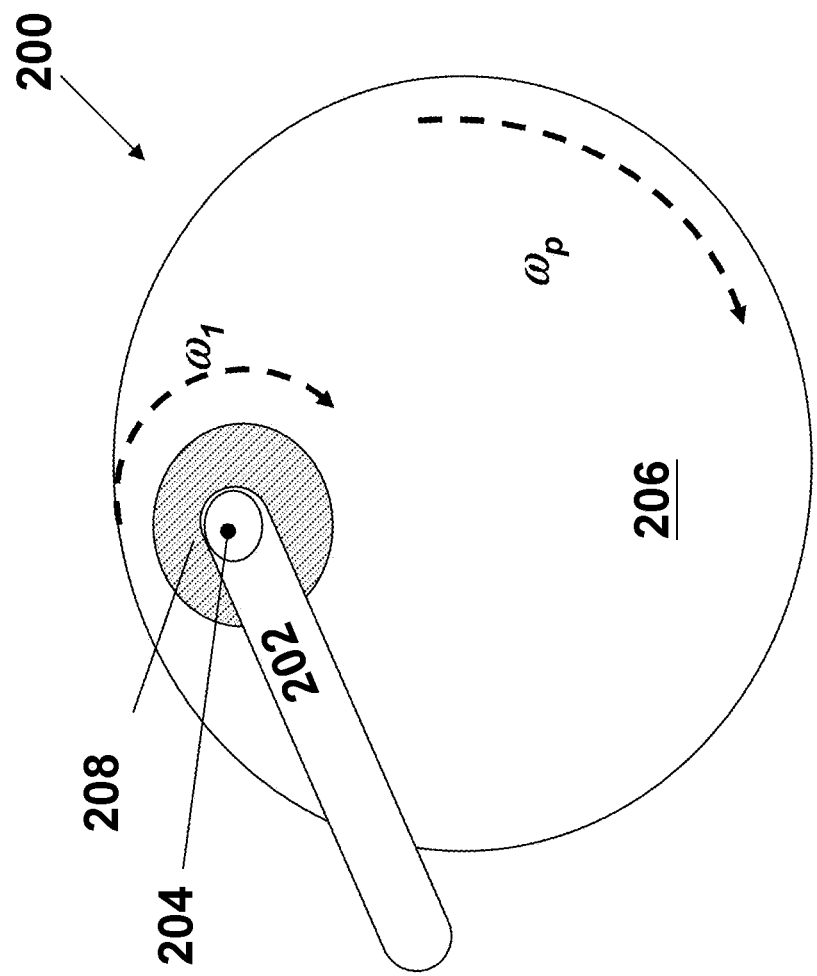
FIG. 2a is a top view of an embodiment of a conditioning apparatus including a conventional conditioning disc.
Figure 2B:
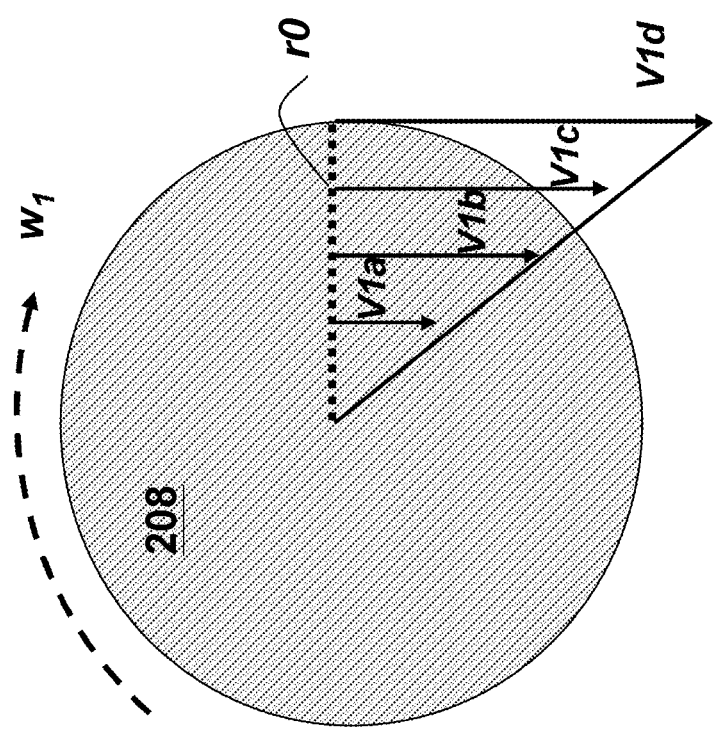
FIG. 2b is a representation of the movement of a conventional conditioning disc.

Referring now to FIGS. 2a, 2b, and 2c, illustrated is a portion of a conditioning device 200. The conditioning apparatus 200 includes a dresser arm (or manipulator) 202 and a dresser head 204. The conditioning device 200 may be substantially similar to the conditioning device 102 of the CMP tool 100, described above with reference to FIG. 1. The dresser arm 202 and dresser head 204 of the conditioning device 200 holds a conventional disc 208. The conventional disc 208 may be an integral, singular, circular disc. The disc 208 operates by rotating about an axis at a single angular velocity $\omega 1$, the singular angular velocity maybe applied to the disc 208 by the dresser head 204. The disc 208 is applied to a polishing pad 206 using a constant force (e.g., a uniform load is applied across the disc 208 by the dresser head 204).

Again, the conventional disc 208 rotates at a single angular velocity $\omega 1$. (The pad 206 also rotates a single angular velocity $\omega p$.) Operating at a singular angular velocity $\omega 1$ provides for a different velocity V1a, V1b, V1c, V1d (FIG. 2b) at various points along the radius r0 of the conventional disc 208. The tangential velocity increases nearer the edge of the disc, e.g., V1d is greater than V1c, etc. The conventional disc 208 may be disadvantageous in that variation in the linear velocity of a disc can affect the "cutting rate" of the disc. Further, the pad 206 may not be uniform and may benefit from controlled conditioning, which is not accounted for in the apparatus 200 including conventional disc 208.

Figure 3B:
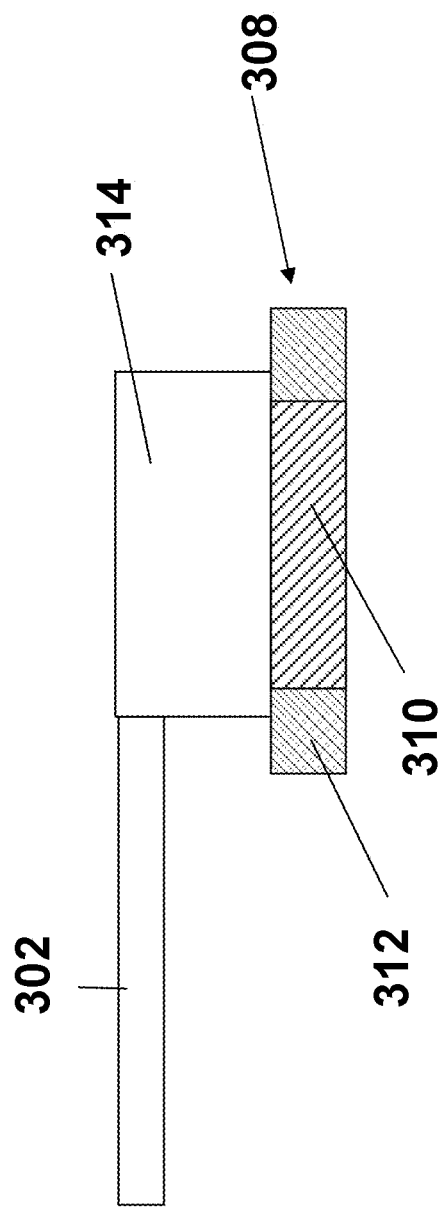
Figure 4:
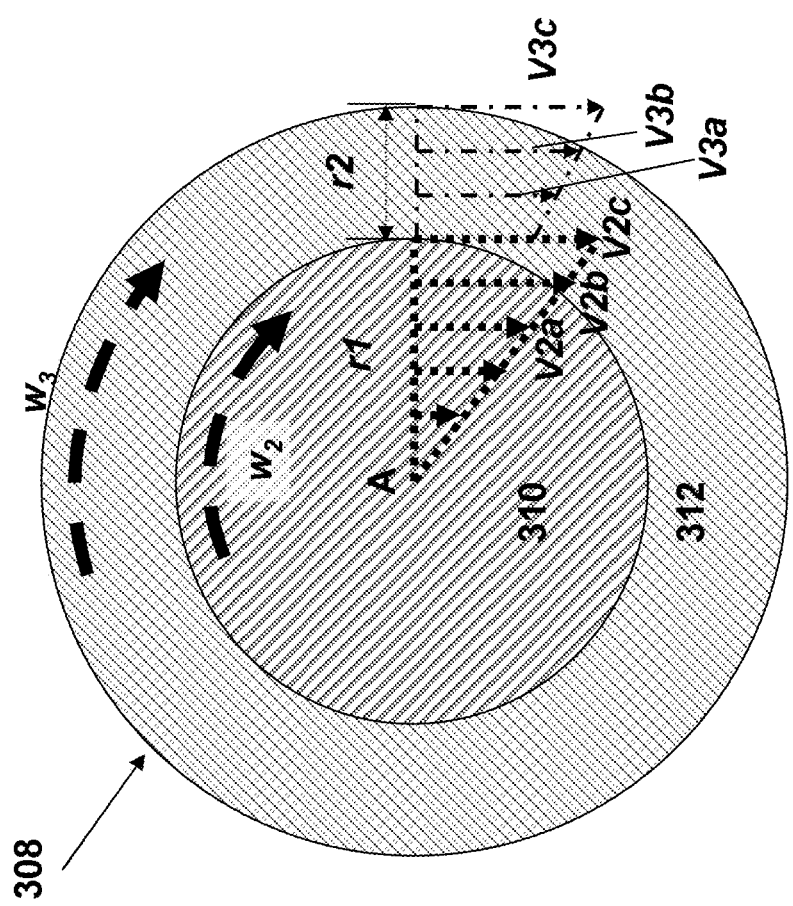
FIG. 4 is a representation of the movement of the conditioning disc of FIG. 3.

Referring now to FIGS. 3a, 3b and 4, illustrated is a conditioning apparatus 300. The conditioning apparatus 300 may be included in the CMP apparatus 100. In an embodiment, the conditioning apparatus 300 is used in lieu of and/or in conjunction with the conditioning device 102, described above with reference to FIG. 1. The conditioning apparatus includes a dresser arm (or manipulator) 302, which follows a path 304 traversing a polishing pad 306. The conditioning apparatus 300 also includes a dresser head 314. The dresser arm 302 provides the dresser head 314 which holds a disc 308. The disc 308 is used for reconditioning and regenerating a polishing pad 306. An exemplary polishing pad 306 is poly-urethane based CMP pad. The disc 308 may condition the polishing pad 306 to provide a flat surface, remove glazing from the pad, restore asperities, and/or other suitable conditioning. The disc 308 may be a diamond CMP conditioner. The dresser head 314 may be operable to apply a load(s) and/or a rotational velocity(s) to the disc 308, as described below.

The disc 308 includes a plurality of subsystem discs (or portions of the disc 308) illustrated as 310 and 312. Though the disc 308 is illustrated as having two subsystem discs (or portions), any number of subsystem discs is possible and within the scope of the present disclosure. See, for example, the discussion of FIGS. 7a and 7b. The subsystem discs 310 and 312 are coupled together to form portions (or zones) of the disc 308. The subsystem discs 310 and 312 include a substantially co-planar surface (i.e., that which interfaces with the polishing pad 306). The subsystem discs 310 and 312 are concentric in that they share the same center axis of rotation. While the subsystem discs 310 and 312 act together to form disc 308, which is swept across the pad 306 by the dresser arm 302 according to the movement 304, the subsystem discs 310 and 312 are operable to act independently in that they can rotate at a different speed and apply a different pressure (or have a different loading or rotational velocity applied to them by the dresser head 314) as discussed further below.

The subsystem disc 310 includes a radius r1. The subsystem disc 312 includes a width r2. The sum of radius r1 and width r2 may provide for substantially the total radius of the disc 308. In other words, there is substantially no gap between the subsystem discs. In an embodiment, the total radius of the disc 308 is substantially equal to the radius r0 of the conventional disc 208. The subsystem disc 310 and subsystem disc 312 are concentric in that they rotate about the same center axis (point A).

Each subsystem disc 310 and 312 is independently controllable in terms of angular velocity and/or applied loading. Applied loading refers to the force applied (e.g., by the dresser head) to the disc at any given point. Thus, the applied loading dictates the pressure applied by the subsystem disc to the pad 306. The subsystem discs 310 and 312 may be controllable by an information handling system (e.g., computer) included in or associated with a CMP tool, such as the CMP tool 100, described above with reference to FIG. 1. For example, the information handling system may be operably coupled to a dresser head and/or other portion of the conditioning apparatus. The loading and/or velocity provided to the subsystem discs 310 and/or 312 may be provided by the dresser head 314. Portions of the dresser head 314 may be substantially similar to as described above with reference to FIG. 1. Additionally, however the dresser head 314 is a multiple-zone dresser head, operable to provide different force, torque, rotation, applied loading, etc to each of the subsystem discs.

As illustrated in FIG. 4, in an embodiment, the first subsystem disc 310 operates at an angular velocity ω2 and the second subsystem disc 312 operates at an angular velocity ω3. Angular velocity ω2 may be different than angular velocity ω3. In an embodiment, the angular velocity ω2 and the angular velocity ω3 may be controlled such as to provide a desired linear velocity (e.g., tangential velocity) at a given point on the disc 308 (as angular velocity ω*radius r=linear velocity V).

For instance, as illustrated in FIG. 4, the linear velocity V3a, V3b, V3c of the subsystem disc 312 may be provided at rate that is more similar, or even substantially similar to, the linear velocity provided by the subsystem disc 310 (e.g., V2a, V2b, V2c). In an embodiment, this is performed by appropriately selecting the angular velocity ω2 and/or angular velocity ω3 such that angular velocity ω multiplied by a given radius along the disc 308 provides a substantially similar velocity V. In an embodiment, the angular velocity ω2 is greater than the angular velocity ω3. Thus, the disc 308 is operable to provide a more uniform environment to the polishing pad 306. This is in contrast to the single angular velocity ω1 of the conventional disc 208, which provides disparate linear velocities. Such variation in the linear velocity of a disc can affect the "cutting rate" of the disc. In other embodiments, the angular velocity ω2 and the angular velocity ω3 may be programmed such as to achieve disparate linear velocities. The control of the angular velocity ω2 and the angular velocity ω3 may allow for improved control over the dressing rate and dressing uniformity of the pad 306. Thus, it allows the pad 306 to in turn have improved performance in polishing a semiconductor wafer (e.g., improved uniformity, reduced scratches, improved pad lifetime, reduction of costs, etc).

The control of the angular velocity ω2 and the angular velocity ω3 may be set for a given pad type, pad age, pad uniformity, and/or other variable. In an embodiment, the angular velocity ω2 and/or the angular velocity ω3 are modified during the conditioning process (e.g., the angular velocity ω is changed as the pad is being conditioned).

Figure 5:
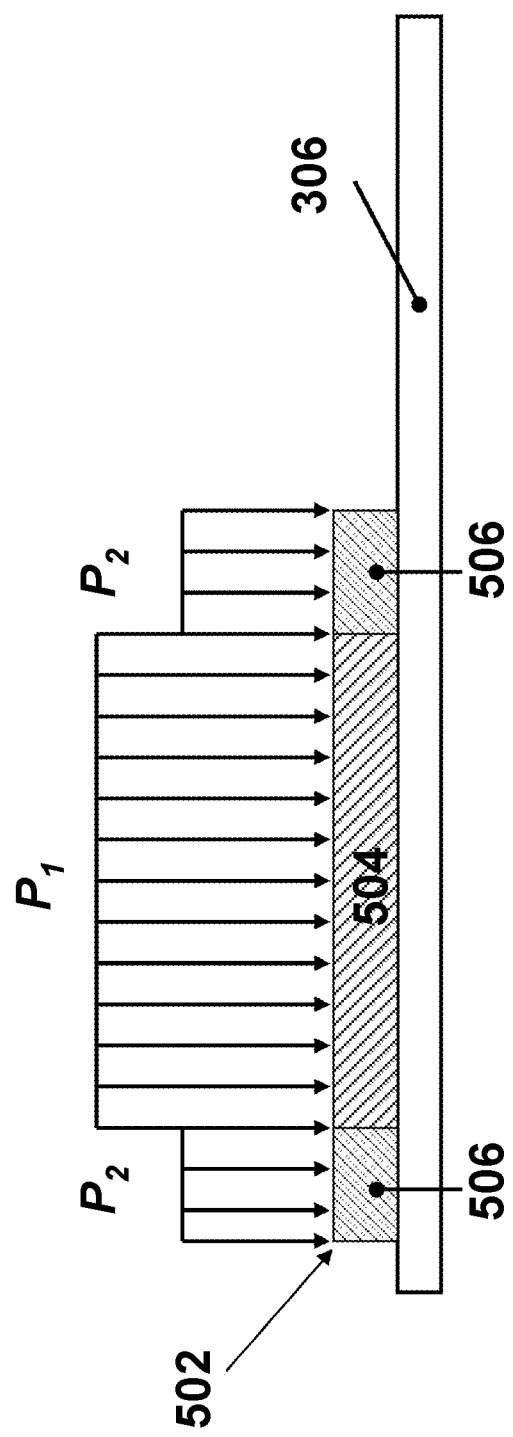
FIG. 5 is a cross-sectional view of an embodiment of a conditioning disc and polishing pad according to one or more aspects of the present disclosure.

Referring now to FIG. 5, illustrated is a dresser disc 502. The dresser disc 502 may be substantially similar to the dresser disc 308, described above with reference to FIGS. 3 and 4. The disc 502 includes a subsystem disc 504 and subsystem disc 506; however, any plurality of subsystem discs is possible. The subsystem discs 504 and 506 may be substantially similar to the subsystem discs 310 and 312, described above with reference to FIGS. 3 and 4. For example, the subsystem discs 504 and 506 may be substantially co-planar and be concentric. The subsystem discs 504 and 506 may be operable to rotate at different angular velocities, as described above with reference to the disc 308. In other embodiments, the subsystem discs 504 and 506 operate at the same angular velocity.

Each of the subsystem discs 504 and 506 is operable to provide a different applied pressure (e.g., force) to the pad 306. The disparate pressure applied by subsystem discs 504 and 506 may be implemented by providing a different applied loading onto each of the subsystem discs 504 and 506, as illustrated by applied force (pressure) $P_1$ with reference to subsystem disc 504 and applied force (pressure) $P_2$ for subsystem disc 506. The applied force $P_1$ with reference to subsystem disc 504 and applied force $P_2$ for subsystem disc 506 may be applied by a dresser head, or portion(s) thereof, coupled to the disc 502. An embodiment is described below with reference to FIG. 6. Thus, in an embodiment, a region of the pad 306 underlying the subsystem disc 504 receives a different pressure having than the region of the pad 306 underlying the subsystem 506. In an embodiment, the applied loading $P_1$ is greater than the applied loading $P_2$.

The control of the applied loading $P_1$ and the applied loading $P_2$ may be set for a given pad type, pad age, pad uniformity, and/or other variable. In an embodiment, the applied loading $P_1$ and the applied loading $P_2$ are modified during the conditioning process (e.g., the applied loading $P_1$ and the applied loading $P_2$ is changed as the pad is being conditioned). The applied loading $P_1$ and $P_2$ may be determined such as to provide a more uniform environment (e.g., constant pressure) to the pad 306. Alternative, the applied loading $P_1$ and $P_2$ may provide for different environments (disparate pressures) for example, to account for inconsistency of the pad 306 (e.g., wear).

The applied loading and the angular velocity may be set and/or modified together or independently of one another. In an embodiment, the subsystems of a disc provide the same angular velocity, and have a different applied loading. In another embodiment, the subsystems of a disc have the same applied loading and have different angular velocities. In yet another embodiment, the subsystems of a disc have different applied loadings and different angular velocities. A dresser head (e.g., multiple-zone dresser head) may provide the different applied loadings and/or different angular velocities.

Figure 6:
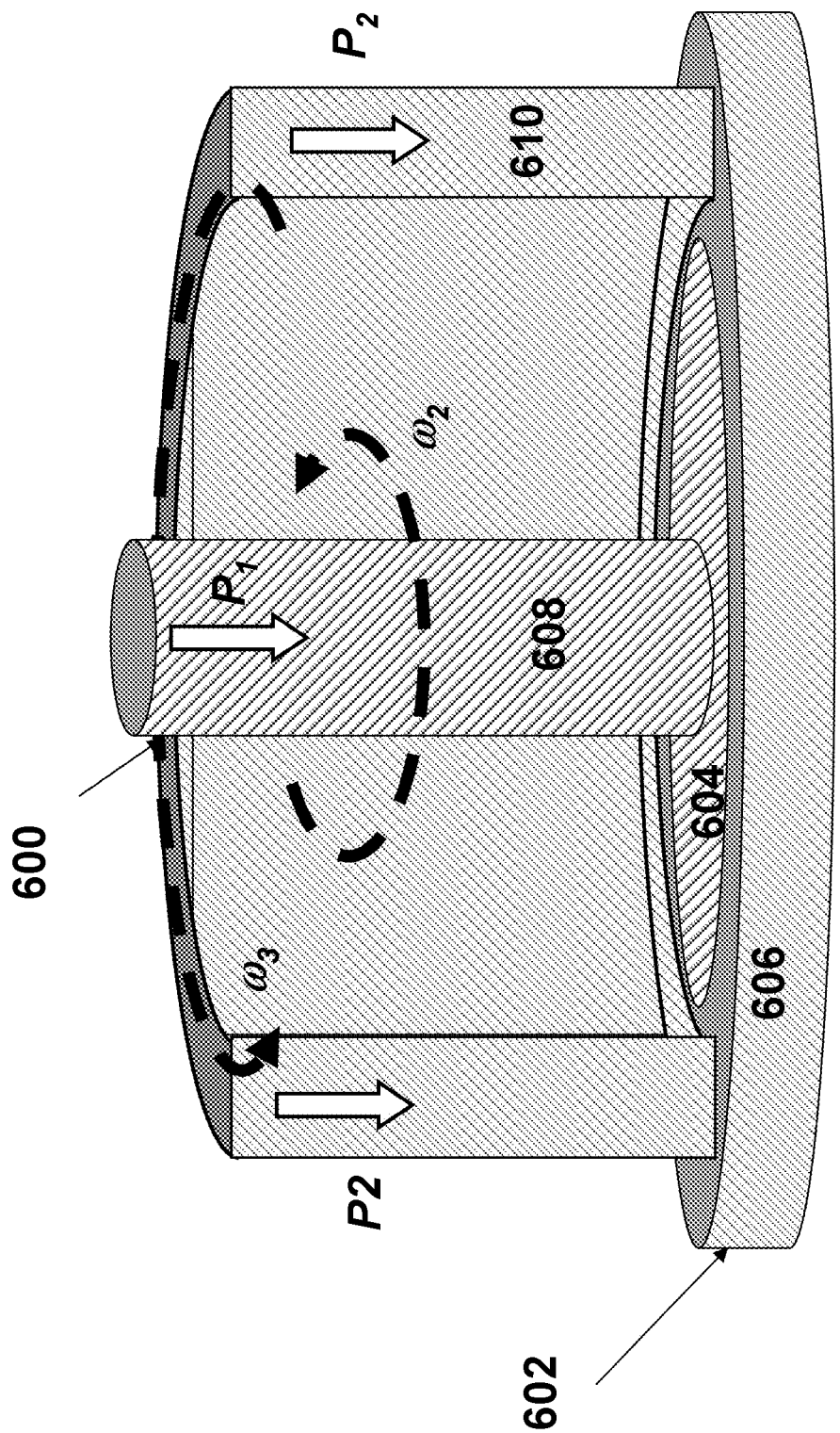
FIG. 6 is a cross-sectional view of an embodiment of a portion of a conditioning apparatus (e.g., dresser head) according to one or more aspects of the present disclosure illustrating the applied pressure.

Referring now to FIG. 6, illustrated is an embodiment of a portion of a conditioning device 600 operable to provide the angular velocity and/or applied loading to a disc 602. The disc 602 including subsystem discs 604 and 606 may be substantially similar to discs 308 or disc 502 described above with reference to FIGS. 3 and 4, and 5, respectively. The conditioning device 600 may be a dresser head (or conditioning head) or portion thereof. The conditioning device 600 may be substantially similar to the dresser head 314 discussed above with reference to FIGS. 3a and 3b. An inner subsystem control device 608 of the device 600 provides a given angular velocity ω2 and applied pressure $P_1$ to the inner subsystem disc 604. An outer subsystem control device 610 of the device 600 provides a given angular velocity ω3 and applied pressure $P_2$ to the outer subsystem disc 606. Again, although two subsystems are shown, any plurality of subsystem discs or regions may be provided. The subsystem control devices 610 and/or 608 may be operably coupled to a control system of a CMP tool which allows a user to vary the angular velocity and applied pressures independently in each subsystem. In an embodiment, subsystem control device 610 and/or 608 may be an integral piece with the respective subsystem disc.

The conditioning device 600 may be included in the CMP tool 100, described above with reference to FIG. 1. For example, the conditioning device may be coupled to the dresser arm 104 and included in the conditioning device 102, also described above with reference to FIG. 1. Further, the conditioning device 600 (e.g., dresser head or portion thereof) may be used in conjunction with disc 308 and/or 502, described above with reference to FIGS. 3, 4, and 5. The dresser head of the conditioning device 600 may be referred to herein as a multiple-zone dresser head. The multiple-zone dresser head may further include elements of known to be used in dresser heads, such as discussed above with reference to FIG. 1.

Figure 7A:
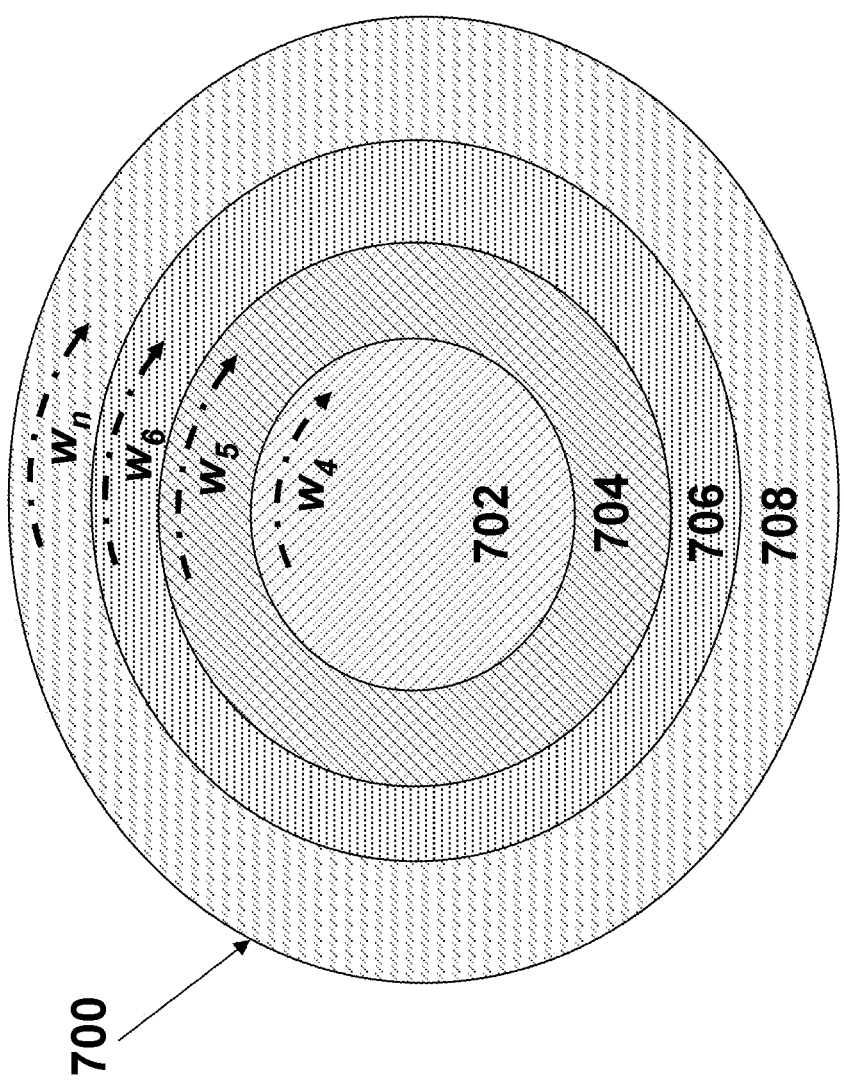
FIGS. 7a and 7b are top view and cross-sectional views of an embodiment of a conditioning disc according to one or more aspects of the present disclosure.
Figure 7B:
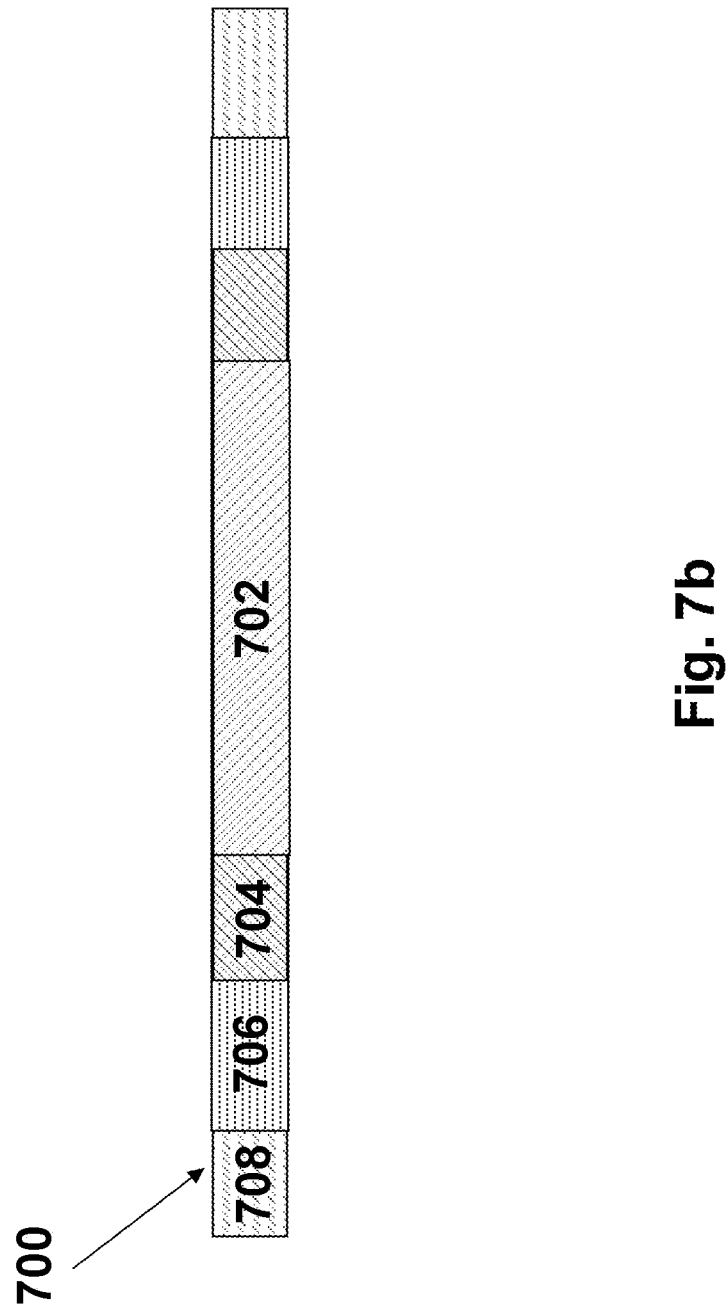

Referring now to FIGS. 7a and 7b, illustrated is a disc 700 including a plurality of subsystem discs 702, 704, 706, and 708. Each of the plurality of subsystem discs 702, 704, 706, and 708 may be separately controlled to provide a different angular velocity and/or applied pressure, substantially similar to as discussed with the embodiments of above. Thus, the disc 700 includes four separately controllable (e.g., by angular velocity and/or pressure) zones which can be provided to a pad. The illustration of FIGS. 7a and 7b is provided to reiterate that although the embodiments above are described as including a disc with two subsystem discs or portions, the present disclosure is not limited thereto.

Referring now to FIG. 8, illustrated is a method 800 of conditioning a pad used for a chemical mechanical polish (CMP) process. The method 800 begins at block 802 where a conditioning device is provided. The conditioning device may be included in a CMP apparatus or tool. In an embodiment, the conditioning device is substantially similar to the device 300, described above with reference to FIG. 3. The conditioning device includes a conditioning or dresser disc. The disc is operable to provide a first portion, which rotates at a first angular velocity and/or is applied with a first pressure; and further includes a second portion, which rotates at a second angular velocity and/or is applied with a second pressure. The first and second angular velocity may be different. The first and second pressure may be different. In some embodiments, additional portions of the disc provide additional angular velocities and/or pressures.

The disc provided in block 802 of the method 800 may be substantially similar to the disc 308, described above with reference to FIGS. 3 and 4; disc 502, described above with reference to FIG. 5; disc 602, described above with reference to FIG. 6; and/or disc 700, described above with reference to FIGS. 7a and 7b. The disc may be positioned on the end of a dresser arm.

The method 800 then proceeds to block 804 where a polishing pad is provided. The polishing pad may be substantially similar to the pad 306, described above. The polishing pad may be positioned on a platen of a CMP tool.

The method of 800 then proceeds to block 806 where the pad provided at block 804 is conditioned using the disc provided at block 802. In an embodiment, simultaneously, the disc operates at least two different angular velocities. In a further embodiment, this allows a relatively consistent tangential velocity to be applied by the disc to the pad. Thus, the pad may experience a more uniform cutting or dressing. In an embodiment, simultaneously, the disc two different applied loadings are provided during the conditioning process to the first and second portion of the disc respectively. Thus, in a further embodiment, the disc may applies at least two different pressures to the pad simultaneously.

In summary, the methods and devices disclosed herein provide for a controllable conditioning process and disc. The disc includes a plurality of subsystem discs that may act together to form the conditioning disc. In an embodiment, the subsystem discs are concentric. Each subsystem disc allows for a different applied loading and/or a different angular velocity to be implemented. Thus, embodiments of the present disclosure are advantageous over the single conditioning angular velocity and pressure.

As described above, in an embodiment, a chemical mechanical polishing (CMP) apparatus is provided. The CMP apparatus includes a conditioning disc for conditioning a polishing pad of the CMP apparatus. The conditioning disc has a first portion operable to rotate at a first angular velocity and a second portion operable to rotate at a second angular velocity. The first and second angular velocities are different. In an embodiment, the CMP apparatus further includes a dresser head which includes a first device for applying a first load to the first portion of the conditioning disc and a second device for applying a second load to the second portion of the conditioning disc. The first and second loads may be different.

In another embodiment, a chemical mechanical polishing (CMP) apparatus is described which includes a platen and a polishing pad disposed on the platen, a dresser arm, and a conditioning disc for the polishing pad coupled to the dresser arm. The conditioning disc includes a first subsystem disc and a second subsystem disc. The first subsystem disc and the second subsystem disc differ in at least one of angular velocity and applied loading. In an embodiment, the second subsystem disc surrounds the first subsystem disc (e.g., the first and second subsystem discs share the same center axis of rotation).

Also described is an embodiment of a method of conditioning a CMP pad. The method includes providing a polishing pad, providing a conditioning disc, and conditioning the polishing pad using the conditioning disc. The conditioning includes rotating a first portion of the disc at a first angular velocity and simultaneously rotating a second portion of the disc at a second angular velocity.

What is claimed is:

1. A CMP apparatus, comprising:
   a conditioning disc for conditioning a polishing pad of a chemical mechanical polish (CMP) apparatus, wherein the conditioning disc has a first portion and a second portion;
   a dresser head coupled to the conditioning disc, wherein the dresser head includes a first portion and a second portion;
   wherein the first portion of the dresser head and the first portion of the conditioning disc form a first integral piece, and wherein the first portion of the dresser head is configured to apply a first force to the first portion of the conditioning disc;
   wherein, at the same time, the second portion of the dresser head and the second portion of the conditioning disc form a second integral piece, and wherein the second portion of the dresser head is configured to apply a second force to the second portion of the conditioning disc while the first portion of the dresser head applies the first force, the second force being different than the first force; and
   wherein the first and second portions of the dresser head are coupled to a controller that is configured to independently control the first and second forces applied to the first and second portions of the conditioning disc by the integrated first and second portions of the dresser head.

2. The apparatus of claim 1, wherein the first portion of the dresser head is configured to provide a first load, and wherein the second portion of the dresser head is configured to provide a second load, different than the first load.

3. The apparatus of claim 1, wherein the first portion of the dresser head is configured to provide a first angular velocity and wherein the second portion of the dresser head is configured to provide a second angular velocity, wherein the first and second angular velocities are different.

4. The apparatus of claim 3, wherein the first and second angular velocities have the same direction.

5. The apparatus of claim 1, further comprising:
   a polishing pad disposed under the conditioning disc; and
   wherein the first portion of the dresser head is further configured to apply a third force to the polishing pad and the second portion of the dresser head is further configured to apply a fourth force to the polishing pad.

6. The apparatus of claim 5, further comprising:
   a mechanism for determining the first force and the second force based on an age of the polishing pad.

7. The apparatus of claim 5,
   wherein the first and second portions of the dresser head are configured to apply the third and fourth force to the polishing pad before a chemical mechanical polish is performed on a semiconductor wafer.

8. The apparatus of claim 1, wherein at least one linear velocity of the first portion of the conditioning disc is substantially similar to at least one linear velocity of the second portion of the conditioning disc.

9. The apparatus of claim 1, wherein the first portion and second portion of the conditioning disc are concentric.

10. A chemical mechanical polishing (CMP) apparatus, including
    a platen and a polishing pad disposed on the platen;
    a dresser arm; and
    a dresser head coupled to the dresser arm;
    a conditioning disc for the polishing pad coupled to the dresser arm, wherein the conditioning disc includes a first subsystem disc and a concentric second subsystem disc, the first subsystem disc and a first portion of the dresser head defining a first integral piece, and the second subsystem disc and a second portion of the dresser head defining a second integral piece; and
    a controller in communication with the dresser head, the controller configured to independently adjust a first intensity of a process parameter applied to the first subsystem disc, by way of the integral first portion of the dresser head, and a second intensity of the process parameter applied to the second subsystem disc, by way of the integral second portion of the dresser head, wherein the process parameter includes at least one of torque, rotation velocity, or applied loading, and wherein the first intensity is different from the second intensity.

11. The CMP apparatus of claim 10, wherein the first and second subsystem discs provide a substantially continuous, co-planar surface for applying to the polishing pad.

12. The CMP apparatus of claim 10, further comprising: a third subsystem disc and a third portion of the dresser head defining a third integral piece.

13. The CMP apparatus of claim 10, wherein the process parameter is applied loading.

14. A CMP apparatus, comprising:
    a polishing pad;
    a conditioning disc for conditioning the polishing pad, the conditioning disc including a first portion rotatable at a first angular velocity and a second portion simultaneously rotatable at a second angular velocity, the two velocities being different;
    a subsystem control device including a first subsystem control portion rotatable at the first angular velocity and a second subsystem control portion rotatable at the second angular velocity, wherein the first subsystem control portion and the first portion of the conditioning disc are formed by a first integral piece, and wherein the second subsystem control portion and the second portion of the conditioning disc are formed by a second integral piece; and
    a controller in communication with the subsystem control device, the controller configured to dynamically provide and change the first and second angular velocities of the first and second portions of the conditioning disc by way of the integral first and second subsystem control portions, respectively.

15. The apparatus of claim 14, wherein the first and second portions are configured to simultaneously apply a first force and a second force, respectively, the two forces being different.

16. The apparatus of claim 15, wherein the first applied force is greater than the second applied force and the second portion of the disc surrounds the first portion of the disc.

17. The apparatus of claim 14, wherein the first and second portions are also rotatable at third and fourth angular velocities, respectively, the third angular velocity being different from the first angular velocity and the fourth angular velocity being different from the second angular velocity.

18. The apparatus of claim 14, wherein the first angular velocity is greater than the second angular velocity and the second portion of the disc surrounds the first portion of the disc.

* * * * *